(12) United States Patent
Kuramoto

(10) Patent No.: US 9,175,953 B2
(45) Date of Patent: Nov. 3, 2015

(54) MEASUREMENT APPARATUS TO CALCULATE WAVEFRONT ABERRATION OF OPTICAL SYSTEM USING SHEARING INTERFERENCE FRINGES, EXPOSURE APPARATUS, AND METHOD OF MANUFACTURING DEVICE

(75) Inventor: Yoshiyuki Kuramoto, Utsunomiya (JP)

(73) Assignee: CANON KABUSHIKI KAISHA (JP)

( * ) Notice: Subject to any disclaimer, the term of this patent is extended or adjusted under 35 U.S.C. 154(b) by 1099 days.

(21) Appl. No.: 12/716,730

(22) Filed: Mar. 3, 2010

(65) Prior Publication Data

US 2010/0233636 A1  Sep. 16, 2010

(30) Foreign Application Priority Data

Mar. 10, 2009 (JP) .................. 2009-057128

(51) Int. Cl.
*G03B 27/72* (2006.01)
*G01B 11/24* (2006.01)
*G01M 11/02* (2006.01)
*G03F 7/20* (2006.01)
*G01B 9/02* (2006.01)

(52) U.S. Cl.
CPC .......... *G01B 11/2441* (2013.01); *G01B 9/0209* (2013.01); *G01B 9/02039* (2013.01); *G01B 9/02057* (2013.01); *G01M 11/0257* (2013.01); *G01M 11/0271* (2013.01); *G03F 7/706* (2013.01)

(58) Field of Classification Search
CPC ....................................... G03F 7/703

USPC ................. 355/71, 67, 53; 356/450, 520, 521
See application file for complete search history.

(56) References Cited

U.S. PATENT DOCUMENTS

2008/0094597 A1*  4/2008  Hirai et al. ....................... 355/67

FOREIGN PATENT DOCUMENTS

| JP | 2004-271334 A |   | 9/2004 |   |
|----|---------------|---|--------|---|
| JP | 2005-183415 A |   | 7/2005 |   |
| JP | 2008-128681   | * | 5/2008 | ............... G01B 9/02 |

* cited by examiner

*Primary Examiner* — Chia-How Michael Liu
(74) *Attorney, Agent, or Firm* — Rossi, Kimms & McDowell LLP

(57) ABSTRACT

A measurement apparatus comprises: a light source; a first optical system configured to reflect a certain component of a light beam emitted by the light source by a final surface thereof and transmit a remaining component of the light beam; a reflecting surface configured to reflect the remaining component; an optical member configured to generate a first shearing interference fringe formed by the certain component, and a second shearing interference fringe formed by the remaining component; an image sensing unit configured to simultaneously sense the first and second shearing interference fringes generated by the optical member; and an arithmetic unit configured to calculate, a wavefront aberration of the first optical system and a wavefront aberration of the first optical system and an optical system to be measured, using data on the first and second shearing interference fringes, thereby calculating a wavefront aberration of the optical system to be measured.

9 Claims, 6 Drawing Sheets

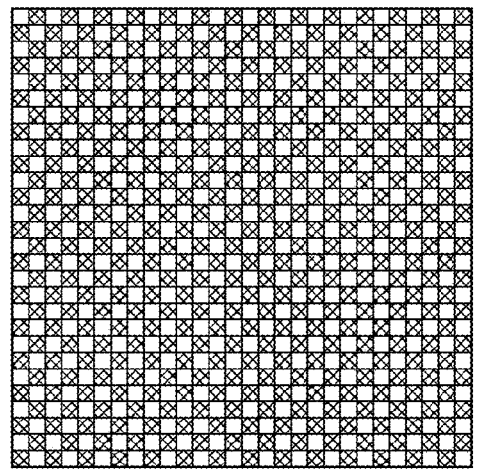
F I G. 2
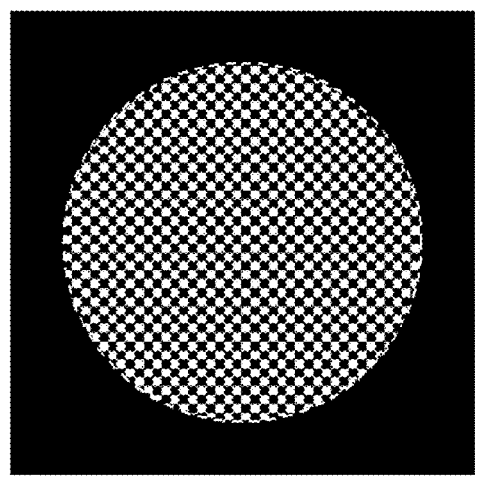
F I G. 3
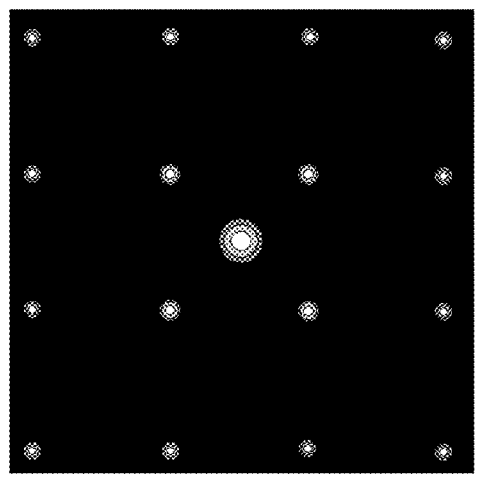
F I G. 4

MEASUREMENT APPARATUS TO CALCULATE WAVEFRONT ABERRATION OF OPTICAL SYSTEM USING SHEARING INTERFERENCE FRINGES, EXPOSURE APPARATUS, AND METHOD OF MANUFACTURING DEVICE

BACKGROUND OF THE INVENTION

1. Field of the Invention

The present invention relates to a wavefront aberration measurement apparatus, an exposure apparatus, and a method of manufacturing a device.

2. Description of the Related Art

Japanese Patent Laid-Open Nos. 2005-183415 and 2004-271334 disclose measurement apparatuses which measure the aberration of an optical system to be measured (test optics) such as a projection optical system (projection optics). An exposure apparatus described in Japanese Patent Laid-Open No. 2005-183415 diffracts light transmitted through the optical system using a diffraction grating, extracts ±1st-order diffracted light beams using a mask member, and measures the wavefront aberration of the optical system based on shearing interference fringes generated by the extracted ±1st-order diffracted light beams. In contrast, Japanese Patent Laid-Open No. 2004-271334 discloses a measurement apparatus which measures the wavefront aberration of the optical system by individually measuring the wavefront aberration of the optical system, including a wavefront aberration attributed to elements other than the optical system, and the wavefront aberration attributed to elements other than the optical system, and calculating the difference between these two wavefront aberrations. The wavefront aberration attributed to elements other than the optical system is generally referred to as system error.

Unfortunately, conventional measurement apparatuses which measure the wavefront aberration of the optical system cannot simultaneously measure both a wavefront aberration attributed to elements other than the optical system and the wavefront aberration of the optical system, including the wavefront aberration attributed to elements other than the optical system. Under such circumstances, the conventional measurement apparatuses suffer from a problem whereby it cannot correct errors associated with a situation in which the aberration attributed to elements other than the optical system changes with time during the measurements of the two wavefront aberrations. In another case, because the arrangement of a measurement system differs between when the wavefront aberration is attributed to elements other than the optical system and when the wavefront aberration is in the path including the optical system, the conventional measurement apparatuses suffer from other problems such that the influence of a change in aberration is attributed to differences in environment and this, in turn, lead to measurement errors.

SUMMARY OF THE INVENTION

The present invention provides a measurement apparatus which can measure the aberration of an optical system to be measured with high accuracy.

According to an aspect of the present invention, there is provided a measurement apparatus which measures a wavefront aberration of an optical system to be measured, the apparatus comprising: a light source; a first optical system which is arranged in an optical path from the light source to the optical system to be measured, and is configured to reflect a certain component of a light beam emitted by the light source by a final surface thereof and transmit a remaining component of the light beam emitted by the light source through the final surface; a reflecting surface configured to reflect a light beam formed from the remaining component transmitted through the first optical system and the optical system to be measured; an optical member configured to generate a first shearing interference fringe formed by a light beam formed from the certain component reflected by the final surface, and a second shearing interference fringe formed by the light beam formed from the remaining component reflected by the reflecting surface; an image sensing unit configured to simultaneously sense both the first shearing interference fringe and the second shearing interference fringe which are generated by the optical member; and an arithmetic unit configured to calculate, a wavefront aberration of the first optical system and a wavefront aberration of both the first optical system and the optical system to be measured, using data on both the first shearing interference fringe and the second shearing interference fringe which are sensed by the image sensing unit, thereby calculating a wavefront aberration of the optical system to be measured based on the two calculated wavefront aberrations.

Further features of the present invention will become apparent from the following description of exemplary embodiments with reference to the attached drawings.

BRIEF DESCRIPTION OF THE DRAWINGS

FIG. 2 is a view showing a two-dimensional diffraction grating;

FIG. 3 is a view showing the intensity distribution of light transmitted through the two-dimensional diffraction grating;

FIG. 4 is a view showing the intensity distribution of light diffracted by the two-dimensional diffraction grating;

DESCRIPTION OF THE EMBODIMENTS

Figure 1:
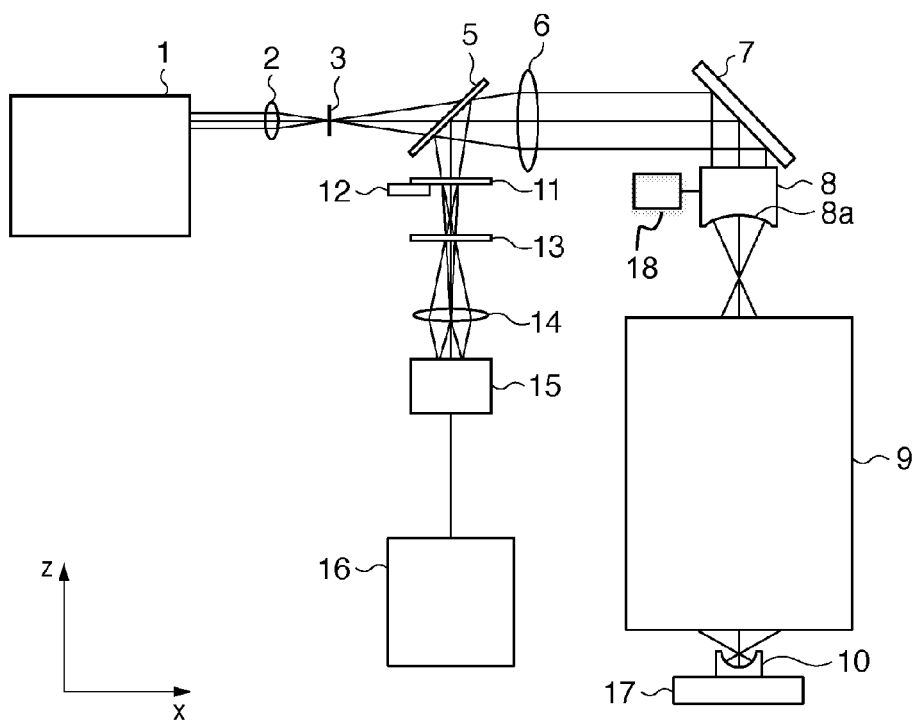
FIG. 1 is a view schematically showing a measurement apparatus according to the first embodiment.

A measurement apparatus which measures the wavefront aberration according to the first embodiment will now be explained with reference to FIG. 1. A light beam emitted by a light source 1 for measurement light with a short temporal coherence length is converged by a condenser lens 2 and has its wavefront shaped by a pinhole 3 which is located at a focal position and has a diameter less than or equal to a diffraction limit. The light beam having passed through the pinhole 3 is transmitted through a half mirror 5 while diverging, becomes incident on a lens 6, is collimated into a collimated light beam by the lens 6, is guided parallel to a stage (not shown) by a mirror 7 mounted on the stage, and becomes incident on a TS lens 8. The TS lens 8 converts the incident light beam to have a desired NA, and has a final surface 8a positioned such that its center of curvature matches a focal position. A certain component of the light beam incident on the TS lens 8 is reflected by the final surface 8a. The final surface 8a will be referred to as a reference surface and a light beam reflected by the final surface 8a will be referred to as a reference light beam (reference beam) hereinafter. The reference light beam is transmitted through the TS lens 8, mirror 7, and lens 6 along nearly the same optical path it has come, and is reflected by the half mirror 5. The condenser lens 2, pinhole 3, half mirror 5, lens 6, mirror 7, and TS lens 8 constitute an optical system (first optical system) which reflects a certain component of a light beam emitted by the light source 1 by the final surface 8a, and transmits the remaining component of the light beam through the final surface 8a. The first optical system is arranged in the optical path from the light source 1 to a projection optical system 9 as an optical system to be measured, as shown in FIG. 1.

In contrast, a light beam formed from the remaining component transmitted through the reference surface 8a without being reflected by the reference surface 8a is converged on the object plane of the projection optical system 9 once, and becomes incident on the projection optical system 9. The light beam transmitted through the projection optical system 9 is reflected by a reflecting surface 10 having its center of curvature located at a position conjugate to that of the focal point on the object plane, and becomes incident on the projection optical system 9 again. The light beam emerging again from the projection optical system 9 on its object side becomes incident on the TS lens 8, passes through the TS lens 8, mirror 7, and lens 6 along nearly the same optical path as that for the reference light beam, and is reflected by the half mirror 5. A light beam transmitted through the projection optical system 9 will be referred to as a light beam to be measured (test beam) hereinafter.

Both the reference light beam and the light beam to be measured are reflected by the half mirror 5 and diffracted by a two-dimensional diffraction grating 11. FIG. 2 shows details of the two-dimensional diffraction grating 11. Referring to FIG. 2, hatched portions indicate light-shielding portions, and non-hatched portions indicate light transmissive portions. A two-dimensional diffraction grating is formed by regularly arranging the light-shielding portions and the light transmissive portions in a checkered pattern. The pattern period of the diffraction grating is determined based on the carrier frequency and the amount of shearing of lateral shearing interference fringes, and a diffraction grating with a period of about 100 µm is typically used. Although a checkered pattern is adopted in this embodiment, another two-dimensional pattern may be selected. Also, the transmission phase may be modulated in a periodic pattern in place of the transmission amplitude.

Figure 5:
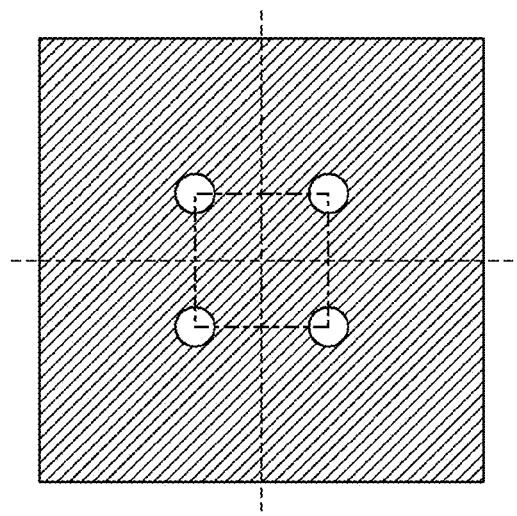
FIG. 5 is a view showing details of an order selecting window.

The light beam transmitted through the two-dimensional diffraction grating 11 has its amplitude modulated into a checkered pattern, as shown in FIG. 3. This modulation generates diffracted light beams of a plurality of orders, as shown in FIG. 4, from the light beam having propagated to the vicinity of the focal position of the lens 6. An order selecting window 13 is set so as to select diffracted light beams of specific orders from the generated diffracted light beams of a plurality of orders. FIG. 5 shows details of the order selecting window 13. Referring to FIG. 5, hatched portions indicate light-shielding portions, and non-hatched portions indicate light transmissive portions. The positions of the non-hatched portions correspond to those of ±1st-order diffracted light beams in the X and Y directions in the diffracted light patterns shown in FIG. 4. The precisions of the patterns indicated by the non-hatched portions can be improved by increasing the diameters of these patterns so that the order selecting window 13 maximally transmits the ±1st-order diffracted light beams up to their tail portions within the range in which diffracted light beams of other orders do not mix in the ±1st-order diffracted light beams.

Figure 8A:
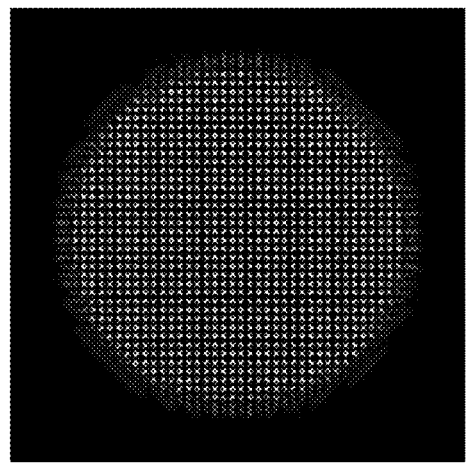
FIGS. 8A to 8C are views showing shearing interference fringes.

The ±1st-order diffracted light beams of the reference light beam transmitted through the order selecting window 13 interfere with each other to generate first shearing interference fringes. Similarly, the ±1st-order diffracted light beams of the light beam to be measured transmitted through the order selecting window 13 interfere with each other to generate second shearing interference fringes. The two-dimensional diffraction grating 11 and order selecting window 13 constitute an optical member which generates first shearing interference fringes formed by the reference light beam and second shearing interference fringes formed by the light beam to be measured. In this embodiment, an optical member including only one optical element generates both first shearing interference fringes and second shearing interference fringes. However, the optical member can include a first optical element which generates first shearing interference fringes and a second optical element which generates second shearing interference fringes. The ±1st-order diffracted light beams of both the reference light beam and the light beam to be measured form images on an image sensing unit (e.g. CCD camera) 15 by a pupil imaging lens 14. In this embodiment, an image sensing unit 15 including only one image sensing element (image sensor) senses both the first shearing interference fringes and the second shearing interference fringes. However, the image sensing unit 15 can include a first image sensing element (first image sensor) which senses the first shearing interference fringes and a second image sensing element (second image sensor) which senses the second shearing interference fringes. Data on both the first shearing interference fringes and the second interference fringes are transmitted to a control device 16. The CCD camera 15 is placed at a position conjugate to that of the reflecting surface 10, and senses the ±1st-order diffracted light beams transmitted through the order selecting window 13. Unless the reflecting surface 10 and CCD camera 15 are placed conjugate to each other, the ±1st-order diffracted light beams become incident on the CCD camera 15 at different angles and are therefore superposed on each other while laterally shifting with respect to the optical axis, thus forming lateral shearing interference fringes containing carrier fringes. Since a two-dimensional diffraction grating is used in this embodiment, two-dimensional lateral shearing interference fringes are formed, as shown in FIG. 8A. Note that a coherence length c/Δν of the light source 1 obtained by dividing the light velocity by a line width Δν of the light source 1, and an optical path length difference L between the light beam to be measured and the reference light beam satisfy a relation: c/Δν<<L. In this case, because the light beam to be measured and the reference light beam do not interfere with each other, the CCD camera 15 senses the intensity sum of lateral interference fringes formed by the respective light beams.

Figure 7:
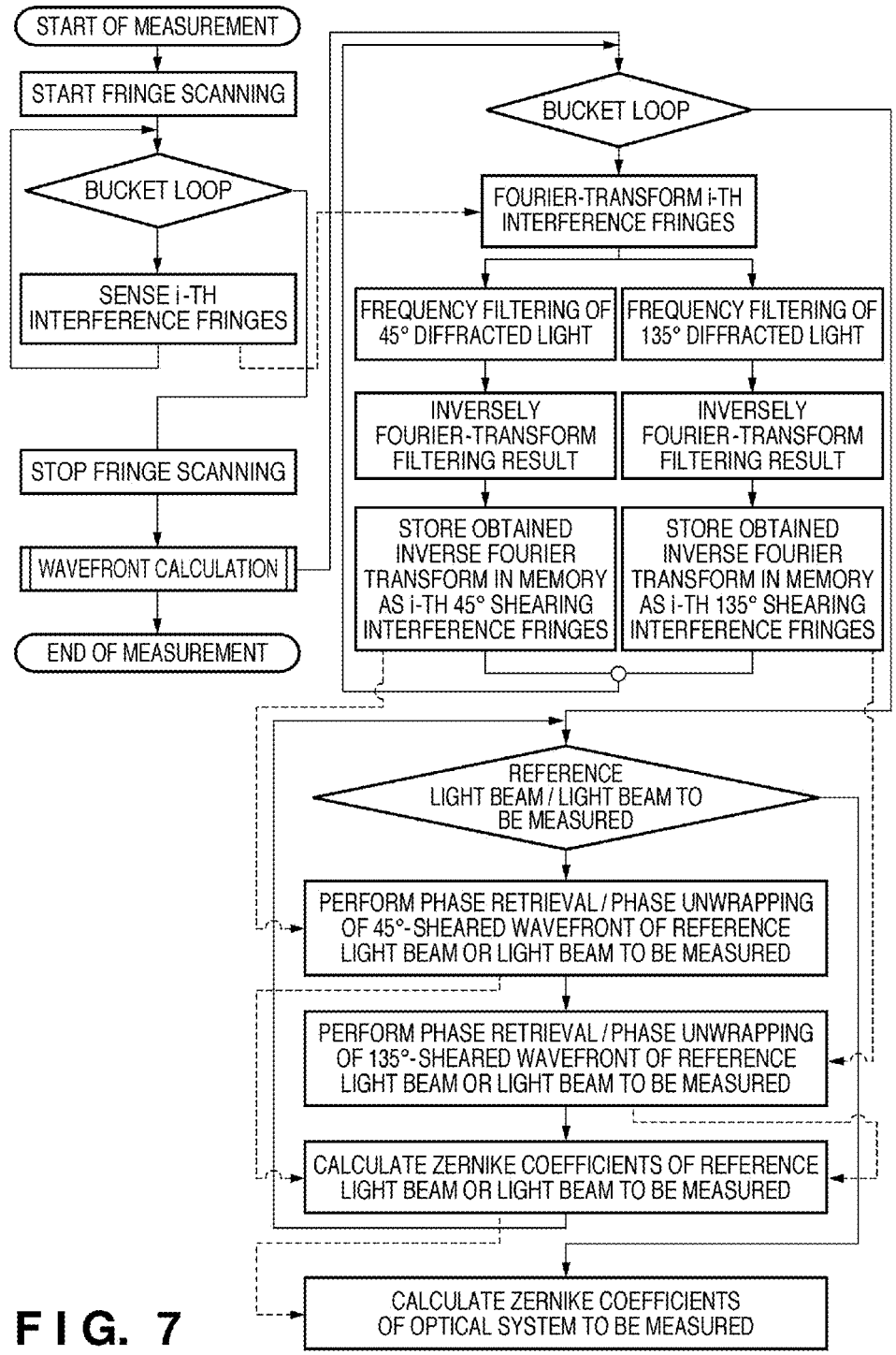
FIG. 7 is a flowchart of wavefront aberration calculation.

The control device 16 controls a sequence for measuring the wavefront from interference fringes. FIG. 7 shows the measurement sequence. Referring to the flowchart shown in FIG. 7, solid lines indicate the procedural flows and dashed lines indicate the data flows. As the measurement starts, shearing interference fringes are scanned so as to separate first shearing interference fringes formed by a reference light beam and second shearing interference fringes formed by a light beam to be measured. In this embodiment, two independent interference fringe scanning mechanisms are used in order to separate first shearing interference fringes formed by a reference light beam and second shearing interference fringes formed by a light beam to be measured by scanning these shearing interference fringes at different phase velocities.

The first interference fringe scanning mechanism is an actuator 12 which drives the two-dimensional diffraction grating 11 in a direction perpendicular to the optical axis of the light beam incident on the two-dimensional diffraction grating 11. The two-dimensional diffraction grating 11 can be scanned in synchronism with the image sensing timing of the CCD camera 15 in response to a command from a controller in the control device 16. In this embodiment, the measurement is performed using diffracted light beams in the ±45° directions corresponding to the apertures in the order selecting window 13 shown in FIG. 5. Hence, the two-dimensional diffraction grating 11 is scanned in the X-axis direction in FIG. 1 so as to generate phase shifts in the respective diffracted light beams. Scanning the two-dimensional diffraction grating 11 makes it possible to generate the same amount of phase shift in both the light beam to be measured and the reference light beam. A phase shift rate $\Delta\Phi\text{ref}$ defined as the amount of phase shift per bucket is given by:

$$\Delta\Phi\text{ref} = 2 \times 2\pi \Delta cg / \lambda cg \quad (1)$$

where $\lambda cg$ is the length of one period of the diffraction grating structure, and $\Delta cg$ is the amount of shift of the two-dimensional diffraction grating 11.

The second interference fringe scanning mechanism is a changing mechanism which changes the tilt of the reflecting surface 10 with respect to the optical axis of the light beam incident on the reflecting surface 10, and exploits the fact that the amount of wavefront tilt corresponds to the piston of lateral shearing interference fringes. When the reflecting surface 10 is a curved surface (concave surface) as in the case of FIG. 1, this mechanism can change the tilt of the reflecting surface 10 with respect to the optical axis of the light beam incident on the reflecting surface 10 by driving, by a stage 17, the reflecting surface 10 in a direction perpendicular to the optical axis of the light beam incident on the curved reflecting surface 10. When the reflecting surface 10 is driven by $\Delta X$ in the X-axis direction, the amount of driving of the focal position after reflection is $2\Delta X$ at the position of the imaging plane of the projection optical system 9 and is $2\Delta X/\beta$ at the position of its object plane. Let fts be the focal length of the TS lens 8, and f1 be the focal length of the lens 6, and assume that the TS lens 8 and lens 6 form a telecentric optical system. Then, an amount of shift $\Delta pr$ of the principal ray in the two-dimensional diffraction grating 11 is given by:

$$\Delta pr = -f1/fts \times 2\Delta X/\beta \quad (2)$$

A phase shift rate $\Delta\Phi\text{test}$ of the light beam to be measured, which is obtained by scanning the two-dimensional diffraction grating 11 and scanning the light beam to be measured by the amount of tilt, is given by:

$$\Delta\Phi\text{test} = 2 \times 2\pi(\Delta cg - \Delta pr)/\lambda cg \quad (3)$$

The simultaneous use of the above-mentioned two interference fringe scanning mechanisms allows independent control of the phase shift rate $\Delta\Phi\text{ref}$ of the reference light beam and the phase shift rate $\Delta\Phi\text{test}$ of the light beam to be measured by adjustment of $\Delta cg$ and $\Delta pr$. In this embodiment, 8-bucket interference fringes in which the phase shift rate $\Delta\Phi\text{test}$ of the light beam to be measured is $\pi/4$ and the phase shift rate $\Delta\Phi\text{ref}$ of the reference light beam is $\pi/2$ are scanned.

Figure 6:
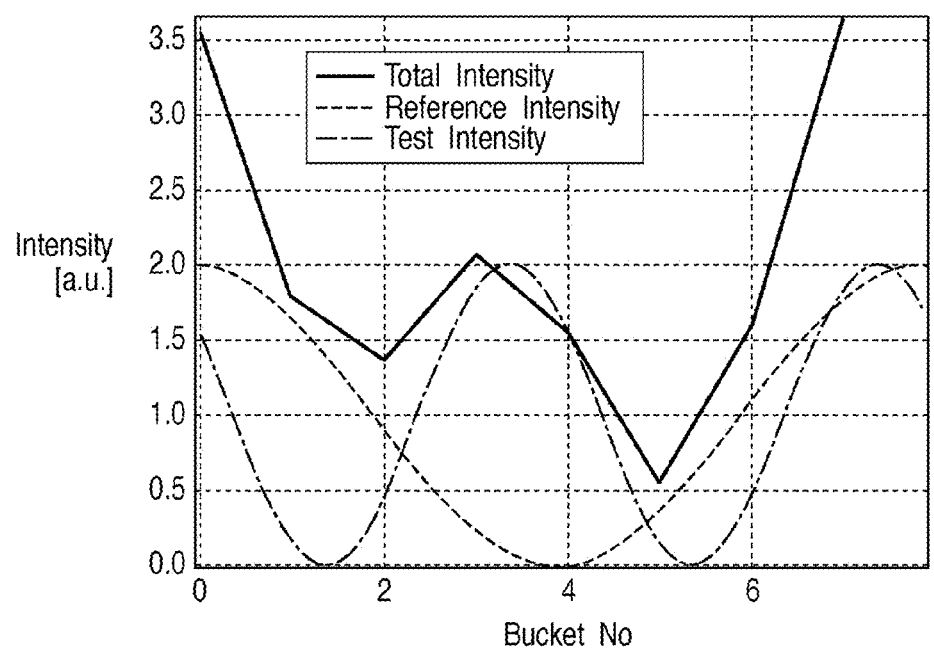
FIG. 6 is a graph showing a change in intensity of interference fringes while they are scanned.

As interference fringe scanning starts, the control device 16 issues an image sensing command to the CCD camera 15 based on the sequence shown in FIG. 7. In response to this command, the 8-bucket shearing interference fringes are sensed in synchronism with the interference fringe scanning, and the interference fringe scanning is completed. When attention is paid to a certain pixel of the shearing interference fringes sensed by the CCD camera 15, a change in intensity of the 8-bucket interference fringes while they are scanned is as shown in FIG. 6. An alternate long and short dashed line in FIG. 6 indicates a change of the second shearing interference fringes of the light beam to be measured scanned at a phase shift rate of $\pi/4$. Also, a dashed line in FIG. 6 indicates a change of the first shearing interference of the reference light beam scanned at a phase shift rate of $\pi/2$. On the CCD camera 15, the intensity sum of the second shearing interference fringes of the light beam to be measured and the first shearing interference fringes of the reference light beam is detected, and the image acquisition time is averaged. Thus, the intensity indicated by a solid line in FIG. 6 is detected.

Figure 8B:
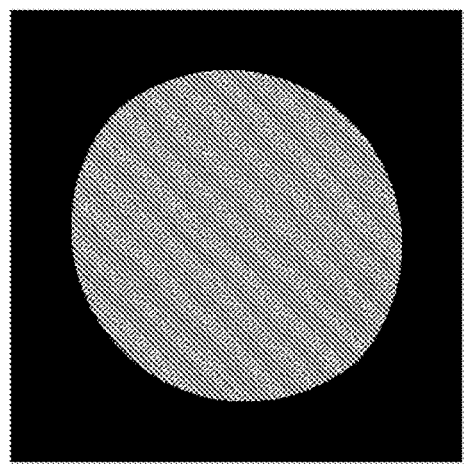
Figure 8C:
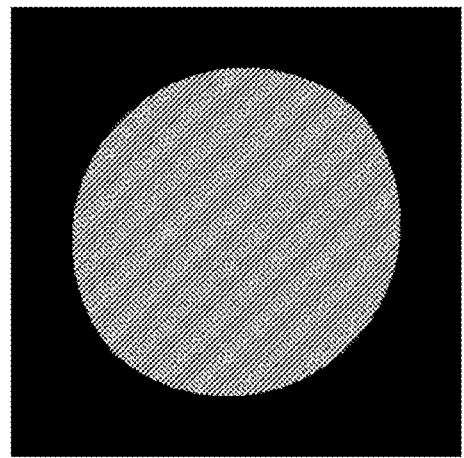

After the interference fringe sensing is completed, wavefront calculation starts. An arithmetic unit in the control device 16 calculates the wavefront aberration. The right side of the flowchart in FIG. 7 shows a detailed sequence for calculating the wavefront aberration by the arithmetic unit in the control device 16. First, the arithmetic unit in the control device 16 separates, by spatial filtering, shearing interference fringes in the 45° direction and those in the 135° direction from each of a plurality of data on the interference fringes sensed by the CCD camera 15 while they are scanned. More specifically, the arithmetic unit two-dimensionally Fourier transforms the respective interference fringe sensing data. The arithmetic unit applies frequency filtering in which only a component corresponding to the spectral position of the 45° shearing interference fringes is passed, and inversely Fourier-transforms the filtering result into an interference fringe intensity distribution. FIGS. 8A to 8C illustrate a calculation example. FIG. 8A shows two-dimensional shearing interference fringes sensed by the CCD camera 15. The arithmetic unit can extract only shearing interference fringes in the 45° direction, as shown in FIG. 8B, by Fourier-transforming the two-dimensional shearing interference fringes and applying frequency filtering to the obtained Fourier transform. The arithmetic unit stores the extracted shearing interference fringes in the 45° direction in a memory of the control device 16. The arithmetic unit performs the same processing for 135° shearing interference fringes shown in FIG. 8C, and stores the result in the memory. After that, the arithmetic unit starts processing of interference fringe data of the next bucket. When the arithmetic unit applies the above-mentioned calculation to all bucket data on interference fringe scanning, the generation of interference fringe scanning data for both the 45° shearing interference fringes and the 135° shearing interference fringes is complete.

The arithmetic unit in the control device 16 calculates the wavefront aberrations of the light beam to be measured and reference light beam. Since the basic calculation sequence is the same between the light beam to be measured and the reference light beam, it is represented by a loop in the flowchart shown in FIG. 7. The arithmetic unit calculates the wavefront aberration of the reference light beam first. The arithmetic unit retrieves the phase in each pixel of the 45° shearing interference fringe scanning data using:

$$\Phi\text{ref} = a\tan(\Sigma I[i]\cos(\pi/4i)/\Sigma I[i]\sin(\pi/4i)) \quad (4)$$

Since the phase retrieved within the two-dimensional pupil plane is convolved by equation (4) in the range of $\pm\pi$, the arithmetic unit calculates the 45°-sheared wavefront by phase unwrapping. The arithmetic unit performs the same procedure for the ±135° shearing interference fringe scanning data to calculate the 135°-sheared wavefront.

The arithmetic unit calculates the wavefront aberration from the calculated 45°- and 135°-sheared wavefronts. In this embodiment, the Zernike coefficients of wavefronts are directly fitted to the sheared wavefronts. Details of this calculation will be explained below. Assume that a wavefront $W(x,y)$ to be measured is given by:

$$W(x, y) = C1 + \quad (5)$$
$$C2*x +$$
$$C3*y +$$
$$C4*(2*x^2 + 2*y^2 - 1) +$$
$$C5*(x^2 - y^2) +$$
$$C6*(2*x*y) +$$
$$C7*(3*x^3 - 2*x + 3*x*y^2) +$$
$$C8*(3*y^3 - 2*y + 3*x^2*y) +$$
$$C9*(6*(x^2 + y^2)^2 - 6*(x^2 - y^2) + 1 +$$
$$\ldots$$

Then, a 45°-sheared wavefront $Ws45(x,y)$ and a 135°-sheared wavefront $Ws135(x,y)$ are respectively given by:

$$Ws45(x, y) = 0 + \quad (6)$$
$$C2*(-2*s) +$$
$$C3*(-2*s) +$$
$$C4*(-8sx - 8sy) +$$
$$C5*(-4sx + 4sy) +$$
$$C6*(-4sx - 4sy) +$$
$$C7*(4*s - 12*s^3 - 18*s*x^2 -$$
$$12*s*x*y - 6*s*y^2) +$$
$$C8*(4*s - 12*s^3 - 6*s*x^2 - 12*s*x*y -$$
$$18*s*y^2) +$$
$$C9*(24*s*x - 96*s^3*x - 48*s*x^3 +$$
$$24*s*y - 96*s^3*y - 48*s*x^2*y -$$
$$48*s*x*y^2 - 48*s*y^3) +$$
$$\ldots$$

$$Ws135(x, y) = 0 + \quad (7)$$
$$C2*(-2*s) +$$
$$C3*(2*s) +$$
$$C4*(-8sx + 8sy) +$$
$$C5*(-4sx - 4sy) +$$
$$C6*(4sx - 4sy) +$$
$$C7*(4*s - 12*s^3 - 18*s*x^2 +$$
$$12*s*x*y - 6*s*y^2) +$$
$$C8*(-4*s + 12*s^3 + 6*s*x^2 -$$
$$12*s*x*y + 18*s*y^2) +$$
$$C9*(24*s*x - 96*s^3*x - 48*s*x^3 -$$
$$24*s*y + 96*s^3*y + 48*s*x^2*y -$$
$$48*s*x*y^2 + 48*s*y^3, 4*s^3 -$$
$$6*s*x^2 - 12*s*x*y + 6*s*y^2)$$

where s is the amount of shearing in both the x and y directions.

The Zernike coefficients of the wavefront to be measured, which are represented by $C2, C3, \ldots$, can be directly calculated by fitting a function system defined by $Ws45(x,y)$ and $Ws135(x,y)$ to the 45°- and 135°-sheared wavefronts obtained as a result of measurement, using the above-mentioned relationship. The arithmetic unit uses the least-square method in actual fitting calculation to calculate coefficients with which the fitting residue is minimized for each of the 45°- and 135°-sheared wavefronts. With the foregoing procedure, the calculation of the Zernike coefficients of the wavefront of the reference light beam is complete.

The arithmetic unit calculates the Zernike coefficients of the wavefront of the light beam to be measured. The wavefront of the light beam to be measured is calculated by the same procedure as used for the reference light beam except that the equation for use in phase retrieval is changed from equation (4) to an equation:

$$\Phi\text{test} = a\tan(\Sigma I[i]\cos(\pi/2i)/\Sigma I[i]\sin(\pi/2i)) \quad (8)$$

Equations (4) and (7) allow independent calculation of the respective phases using the difference in phase shift rate between the light beam to be measured and the reference light beam. Although an equation based on discrete Fourier transformation is used in this embodiment, an algorithm which produces a disturbance filtering effect as in a general bucket algorithm may be used. In this case, it is necessary to prevent the mutual influence between arithmetic algorithms for the light beam to be measured and the reference light beam.

In this embodiment, the second interference fringe scanning mechanism is a changing mechanism which changes the tilt of the reflecting surface 10 with respect to the optical axis of the light beam incident on the reflecting surface 10. Alternatively, the second interference fringe scanning mechanism can be a changing mechanism 18 which changes the tilt of the final surface 8a with respect to the optical axis of the light beam incident on the final surface 8a. Or again, the second interference fringe scanning mechanism can be a driving mechanism which drives the final surface 8a in a direction perpendicular to the optical axis of the light beam incident on the final surface 8a when the final surface 8a is a curved surface (convex surface), as shown in FIG. 1. Although both the light beam to be measured and the reference light beam are scanned in this embodiment, one of them may be scanned while the other one is fixed. In this case, to retrieve the phase of a light beam, interference fringes of which are not scanned, it is only necessary to employ a method such as the FFT method, which extracts interference fringe components that are not scanned and retrieves the phase from stationary interference fringes.

Lastly, the arithmetic unit in the control device 16 calculates Zernike coefficients as the aberration of the projection optical system 9 by subtracting the Zernike coefficients of the reference light beam, which bear the aberration information in the optical path other than the projection optical system 9, from those of the light beam to be measured, which bear the aberration information of the projection optical system 9. With the foregoing procedure, the wavefront aberration measurement of the projection optical system 9 is complete. It is also possible, as needed, to separately correct error components other than the aberration of the projection optical system 9, which are attributed to factors other than the optical path length difference between the optical path to be measured and the reference optical path and are typified by a surface shape error of the reflecting surface 10 and that of the final surface 8a of the TS lens 8.

In this embodiment, the above-mentioned arrangement is adopted so as to match as much as possible the optical paths along which the reference wavefront and the wavefront to be measured respectively travel. However, the two-dimensional diffraction grating 11 and CCD camera 15 may be set independently of the optical system using, for example, a half mirror as the mirror 7 and a light beam transmitted through the mirror 7 as a reference wavefront.

As described above, according to the first embodiment, it is possible to simultaneously measure the wavefront aberration of a light beam reflected by the reference surface without becoming incident on the projection optical system 9 and that of a light beam transmitted through the projection optical system 9. This, in turn, makes it possible to stably, accurately measure the wavefront aberration of the projection optical system 9 irrespective of a fluctuation in aberration of light which illuminates the projection optical system 9 as an optical system to be measured.

Figure 9:
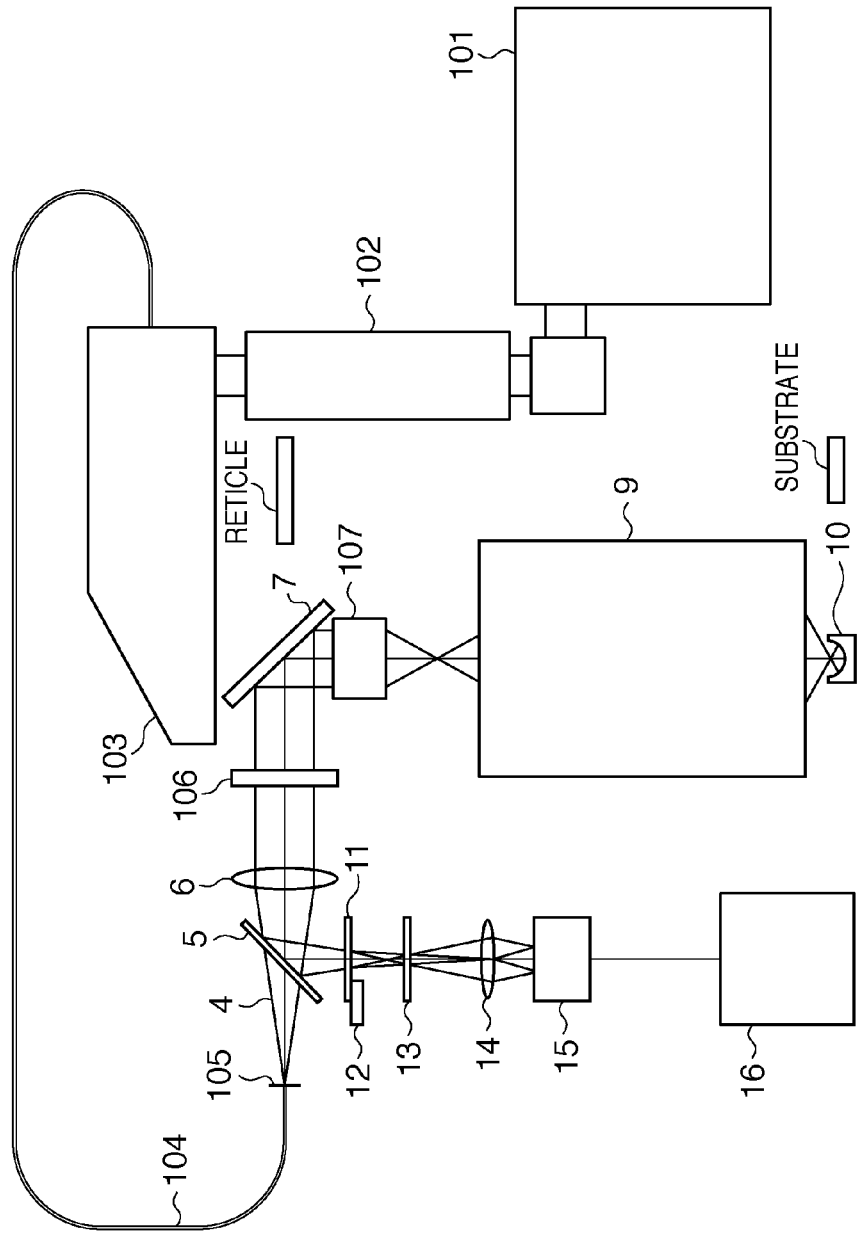
FIG. 9 is a view schematically showing a measurement apparatus according to the second embodiment.

The second embodiment will be explained with reference to FIG. 9. In the second embodiment, a wavefront aberration measurement apparatus is mounted in an exposure apparatus. A light beam emitted by an exposure light source 101 has its spatial coherence lowered by an incoherent unit 102, and enters an illumination optical system 103. The illumination optical system 103 is a unit for illuminating a reticle located on the object plane of a projection optical system 9, and is not used to measure the wavefront aberration of the projection optical system 9. The illumination optical system 103 not only exhibits an illumination function but also partially guides the incident light beam to a fiber 104 for use in light beam propagation. The light beam emerging from the fiber 104 is used to measure the wavefront aberration. The light beam emerging from the fiber 104 has its spatial mode adjusted by a mask 105, is transmitted through a half mirror 5 while diverging, and becomes incident on a lens 6. The light beam emerging from the lens 6 is collimated into a collimated light beam and becomes incident on a flat reference surface 106. The flat reference surface 106 is placed at a position conjugate to that of a reflecting surface 10 (to be described later). The flat reference surface 106 partially reflects the incident light, and the reflected light beam is reflected again by the half mirror 5 and becomes incident on a two-dimensional diffraction grating 11. A light beam reflected by the flat reference surface 106 will be referred to as a reference light beam hereinafter.

In contrast, a light beam transmitted through the flat reference surface 106 is guided parallel to a stage (not shown) by a mirror 7 mounted on the stage and becomes incident on a collimator lens 107. The collimator lens 107 converts the incident light beam to have a desired NA and outputs the converted light beam to the projection optical system 9. The collimator lens 107 is designed to sufficiently stabilize the transmission wavefront through it within the fluctuation range of the environment under which it is placed, and therefore has a virtually constant aberration. The light beam incident on the projection optical system 9 is converged on the image plane of the projection optical system 9 once, is reflected by the reflecting surface 10 positioned such that its center of curvature matches a focal position, is transmitted through the projection optical system 9 again, and reaches the half mirror 5 upon passing through the same optical path it has come. The light beam reflected by the half mirror 5 becomes incident on the two-dimensional refraction grating 11. A light beam which is transmitted through the projection optical system 9 and reflected by the reflecting surface 10 will be referred to as a light beam to be measured hereinafter.

Both the light beam to be measured and the reference light beam are diffracted by the two-dimensional diffraction grating 11, have their diffraction orders selected by an order selecting window 13, and form images on a CCD camera 15 placed conjugate to the reflecting surface 10. Because the two-dimensional diffraction grating 11 is placed at a position that is not conjugate to that of the CCD camera 15, two-dimensional lateral shearing interference fringes are observed on the CCD camera 15. The wavefront aberrations of the light beam to be measured and reference light beam are calculated based on the two-dimensional lateral shearing interference fringes by applying the calculation sequence shown in FIG. 7 to interference fringe data obtained by synchronously controlling an actuator 12 of the two-dimensional diffraction grating 11 and the position of the reflecting surface 10 in a direction perpendicular to the optical axis. In this embodiment, the same measurement can also be done by controlling the tilt of the flat reference surface 106, instead of controlling the position of the reflecting surface 10. Lastly, an arithmetic unit in a control device 16 calculates the wavefront aberration of the projection optical system 9 as an optical system to be measured by subtracting the wavefront aberration of the reference light beam from the calculation result of the wavefront aberration of the light beam to be measured. Note that so-called system errors typified by the wavefront aberration of the collimator lens 107 and factors associated with the reflecting surface 10 are measured in advance and corrected based on the measurement results as needed.

A multimode fiber is generally used as the fiber for use in propagation of the measurement light beam in this embodiment with regard to deep-ultraviolet wavelengths used in the exposure light source 101. The use of a multimode fiber poses a problem that the wavefront aberration of light incident on the fiber readily changes in response to a change in, for example, stress acting on the fiber. In this embodiment, since the wavefront aberrations of the reference light beam and light beam to be measured are measured simultaneously, it is possible to stably measure the wavefront aberration of the projection optical system 9 irrespective of a change in wavefront aberration of the fiber 104.

A method of manufacturing devices such as a semiconductor integrated circuit device and a liquid crystal display device will be exemplified next. The devices are manufactured by an exposure step of exposing a substrate using the exposure apparatus according to the second embodiment, a development step of developing the substrate exposed in the exposure step, and known subsequent steps of processing the substrate developed in the development step. The known subsequent steps are, for example, etching, resist removal, dicing, bonding, and packaging steps. Since the exposure apparatus used in the exposure step includes a projection optical system having its wavefront aberration adjusted using a measurement apparatus mounted in it, it can expose the substrate with high accuracy.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-057128, filed Mar. 10, 2009, which is hereby incorporated by reference herein in its entirety.

What is claimed is:

1. A measurement apparatus for measuring a wavefront aberration of an optical system to be measured, the apparatus comprising:
   a light source;
   a first optical system arranged in an optical path from said light source to the optical system to be measured, and configured to reflect a certain component of a light beam emitted by said light source by a final surface thereof and transmit a remaining component of the light beam emitted by said light source through the final surface;

a reflecting surface configured to reflect a light beam including the remaining component transmitted through said first optical system and the optical system to be measured;

a diffraction grating configured to:
  generate first laterally shifted wavefronts from the certain component reflected by the final surface and generate a first shearing interference fringe by interfering the first laterally shifted wavefronts, each of the first laterally shifted wavefronts having an aberration of the first optical system; and
  generate second laterally shifted wavefronts from the remaining component reflected by said reflecting surface and generate a second shearing interference fringe by interfering the second laterally shifted wavefronts, each of the second laterally shifted wavefronts having an aberration of the first optical system and the optical system to be measured;

a changing mechanism configured to change a tilt of the final surface or a tilt of said reflecting surface for shifting a first phase of the certain component reflected by the final surface;

a driving mechanism configured to drive the diffraction grating for shifting the first phase and a second phase of the remaining component reflected by said reflecting surface at the same velocity;

a controller configured to control said changing mechanism and said driving mechanism so that the first phase and the second phase are each shifted at a different velocity;

an image sensing unit configured to sense both the first shearing interference fringe and the second shearing interference fringe generated by said diffraction grating while shifting the first phase and the second phase each at the different velocity; and an arithmetic unit configured to calculate, a wavefront aberration of said first optical system and a wavefront aberration of both said first optical system and the optical system to be measured, using data on both the first shearing interference fringe and the second shearing interference fringe sensed by said image sensing unit, and calculate a wavefront aberration of the optical system to be measured based on the two calculated wavefront aberrations.

2. The apparatus according to claim 1, wherein said diffraction grating includes a two-dimensional diffraction grating configured to generate a plurality of diffracted light beams which form a shearing interference fringe in two directions at right angles to each other.

3. The apparatus according to claim 1, wherein said diffraction grating includes:
  a first optical element configured to generate the first laterally shifted wavefronts and generate the first shearing interference fringe by interfering the first laterally shifted wavefronts; and
  a second optical element configured to generate the second laterally shifted wavefronts and generate the second shearing interference fringe by interfering the second laterally shifted wavefronts.

4. The apparatus according to claim 3, wherein said image sensing unit includes:
  a first image sensing element configured to sense the first shearing interference fringe generated by said first optical element; and
  a second image sensing element configured to sense the second shearing interference fringe generated by said second optical element.

5. The apparatus according to claim 1, wherein:
the changing mechanism is configured to change the tilt of the final surface with respect to an optical axis of the light beam incident on the final surface, or the tilt of said reflecting surface with respect to an optical axis of the light beam incident on said reflecting surface, and
the driving mechanism is configured to drive said diffraction grating in a direction perpendicular to an optical axis of the light beam incident on said diffraction grating.

6. The apparatus according to claim 5, wherein:
one of the final surface or said reflecting surface is a curved surface, and
said changing mechanism drives the final surface in the direction perpendicular to the optical axis of the light beam incident on the final surface or drives said reflecting surface in a direction perpendicular to the optical axis of the light beam incident on said reflecting surface.

7. An exposure apparatus for projecting a pattern of a reticle onto a substrate via a projection optical system to expose the substrate, the apparatus comprising:
  a measurement apparatus for measuring a wavefront aberration of an optical system to be measured, the measurement apparatus comprising:
    a light source;
    a first optical system arranged in an optical path from said light source to the optical system to be measured, and configured to reflect a certain component of a light beam emitted by said light source by a final surface thereof and transmit a remaining component of the light beam emitted by said light source through the final surface;
    a reflecting surface configured to reflect a light beam including the remaining component transmitted through said first optical system and the optical system to be measured;
    a diffraction grating configured to:
      generate first laterally shifted wavefronts from the certain component reflected by the final surface and generate a first shearing interference fringe by interfering the first laterally shifted wavefronts, each of the first laterally shifted wavefronts having an aberration of the first optical system; and
      generate second laterally shifted wavefronts from the remaining component reflected by the reflecting surface and generate a second shearing interference fringe by interfering the second laterally shifted wavefronts, each of the second laterally shifted wavefronts having an aberration of the first optical system and the optical system to be measured;
    a changing mechanism configured to change a tilt of the final surface or a tilt of said reflecting surface for shifting a first phase of the certain component reflected by the final surface;
    a driving mechanism configured to drive the diffraction grating for shifting the first phase and a second phase of the remaining component reflected by said reflecting surface at the same velocity;
    a controller configured to control said changing mechanism and said driving mechanism so that the first phase and the second phase are each shifted at a different velocity;
    an image sensing unit configured to sense both the first shearing interference fringe and the second shearing interference fringe generated by said diffraction grating while shifting the first phase and the second phase each at the different velocity; and an arithmetic unit configured to calculate, a wavefront aberration of said first optical system and a wavefront aberration of both said first optical system and the optical system to be measured, using data on both the first shearing interference fringe and the second shearing interference fringe sensed by said image sensing unit, and calculate a wavefront aberration of the optical system to be measured based on the two calculated wavefront aberrations.

8. A method of manufacturing a device, the method comprising the steps of:
exposing a substrate to radiant energy using an exposure apparatus;
developing the exposed substrate; and
processing the developed substrate to manufacture the device,
wherein the exposure apparatus comprises a measurement apparatus configured to measure a wavefront aberration of a projection optical system as an optical system to be measured, and
wherein the measurement apparatus comprises:
a light source;
a first optical system arranged in an optical path from the light source to the optical system to be measured, and configured to reflect a certain component of a light beam emitted by the light source by a final surface thereof and transmit a remaining component of the light beam emitted by the light source through the final surface;
a reflecting surface configured to reflect a light beam including the remaining component transmitted through the first optical system and the optical system to be measured;
a diffraction grating configured to:
generate first laterally shifted wavefronts from the certain component reflected by the final surface and generate a first shearing interference fringe by interfering the first laterally shifted wavefronts, each of the first laterally shifted wavefronts having an aberration of the first optical system; and
generate second laterally shifted wavefronts from the remaining component reflected by the reflecting surface and generate a second shearing interference fringe by interfering the second laterally shifted wavefronts, each of the second laterally shifted wavefronts having an aberration of the first optical system and the optical system to be measured;
a changing mechanism configured to change a tilt of the final surface or a tilt of said reflecting surface for shifting a first phase of the certain component reflected by the final surface;
a driving mechanism configured to drive the diffraction grating for shifting the first phase and a second phase of the remaining component reflected by said reflecting surface at the same velocity;
a controller configured to control said changing mechanism and said driving mechanism so that the first phase and the second phase are each shifted at a different velocity;
an image sensing unit configured to sense both the first shearing interference fringe and the second shearing interference fringe generated by the diffraction grating while shifting the first phase and the second phase each at the different velocity; and
an arithmetic unit configured to calculate, a wavefront aberration of the first optical system and a wavefront aberration of both the first optical system and the optical system to be measured, using data on both the first shearing interference fringe and the second shearing interference fringe sensed by the image sensing unit, and calculate a wavefront aberration of the optical system to be measured based on the two calculated wavefront aberrations.

9. A measurement apparatus for measuring a wavefront aberration of an optical system to be measured, the apparatus comprising:
an optical member configured to:
generate first laterally shifted wavefronts from the certain component reflected by the final surface and generate a first shearing interference fringe by interfering the first laterally shifted wavefronts, each of the first laterally shifted wavefronts having an aberration of the first optical system; and
generate second laterally shifted wavefronts from the remaining component reflected by said reflecting surface and generate a second shearing interference fringe by interfering the second laterally shifted wavefronts, each of the second laterally shifted wavefronts having an aberration of the first optical system and the optical system to be measured;
a changing mechanism configured to change a tilt of the final surface or a tilt of said reflecting surface for shifting a first phase of the certain component reflected by the final surface;
a driving mechanism configured to drive the optical member for shifting the first phase and a second phase of the remaining component reflected by said reflecting surface at the same velocity;
a controller configured to control said changing mechanism and said driving mechanism so that the first phase and the second phase are each shifted at a different velocity;
an image sensing unit configured to sense both the first shearing interference fringe and the second shearing interference fringe generated by said optical member while shifting the first phase and the second phase each at the different velocity; and
an arithmetic unit configured to calculate, a wavefront aberration of said first optical system and a wavefront aberration of both said first optical system and the optical system to be measured, using data on both the first shearing interference fringe and the second shearing interference fringe sensed by said image sensing unit, and calculate a wavefront aberration of the optical system to be measured based on the two calculated wavefront aberrations.

* * * * *